(12) United States Patent
Bae et al.

(10) Patent No.: US 10,643,933 B2
(45) Date of Patent: May 5, 2020

(54) SEMICONDUCTOR PACKAGE SUBSTRATE AND MANUFACTURING METHOD THEREFOR

(71) Applicant: HAESUNG DS CO., LTD., Changwon-si (KR)

(72) Inventors: In Seob Bae, Changwon-si (KR); Sung Il Kang, Gimhae-si (KR)

(73) Assignee: Haesung DS CO., LTD., Changwon-si (KR)

( * ) Notice: Subject to any disclaimer, the term of this patent is extended or adjusted under 35 U.S.C. 154(b) by 0 days.

(21) Appl. No.: 16/085,496

(22) PCT Filed: Nov. 14, 2016

(86) PCT No.: PCT/KR2016/013053
§ 371 (c)(1),
(2) Date: Sep. 14, 2018

(87) PCT Pub. No.: WO2017/175944
PCT Pub. Date: Oct. 12, 2017

(65) Prior Publication Data
US 2019/0122968 A1 Apr. 25, 2019

(30) Foreign Application Priority Data

Apr. 6, 2016 (KR) .................. 10-2016-0042401

(51) Int. Cl.
*H01L 23/495* (2006.01)
*H01L 23/00* (2006.01)
(Continued)

(52) U.S. Cl.
CPC .... *H01L 23/49558* (2013.01); *H01L 21/4803* (2013.01); *H01L 21/4828* (2013.01);
(Continued)

(58) Field of Classification Search
CPC ......... H01L 23/49558; H01L 23/49827; H01L 23/49861; H01L 23/49838; H01L 23/053;
(Continued)

(56) References Cited

U.S. PATENT DOCUMENTS

| 8,933,481 B2* | 1/2015 | Wang ................ H01L 33/62 257/676 |
| 9,947,848 B2* | 4/2018 | Sakamoto ............ H01L 33/54 |

(Continued)

FOREIGN PATENT DOCUMENTS

| KR | 1020110124482 A | 11/2011 |
| KR | 1020120116825 A | 10/2012 |

(Continued)

OTHER PUBLICATIONS

International Search Report and Written Opinion for PCT/KR2016/013053 dated Feb. 20, 2017; 10 pages, including English translation of Search Report.

(Continued)

*Primary Examiner* — Dao H Nguyen
(74) *Attorney, Agent, or Firm* — Schwabe Williamson & Wyatt, P.C.

(57) ABSTRACT

Provided are a semiconductor package substrate and a manufacturing method thereof having improved pattern accuracy and product reliability with simple manufacturing processes. The semiconductor package substrate includes a base substrate having a conductive material, and including a first area, on which chips are mounted, including first recesses or first trenches in a surface, and a second area contacting the first area and including dummy recesses or dummy trenches in a surface; and a resin filled in the first recesses or the first trenches and the dummy recesses or the dummy trenches.

9 Claims, 5 Drawing Sheets

(51) Int. Cl.
*H01L 23/053* (2006.01)
*H01L 23/13* (2006.01)
*H01L 21/48* (2006.01)
*H01L 23/14* (2006.01)

(52) U.S. Cl.
CPC ............ *H01L 23/00* (2013.01); *H01L 23/053* (2013.01); *H01L 23/13* (2013.01); *H01L 23/142* (2013.01)

(58) Field of Classification Search
CPC ....... H01L 23/00; H01L 23/13; H01L 23/142; H01L 21/4828; H01L 21/4803; H01L 21/486
USPC ............ 257/666, 676, 773, 98, 99, E23.043, 257/E23.046, E23.124, E23.174, E21.499, 257/E21.585, E33.059, E33.061, E33.062, 257/E33.066, E33.072; 438/106, 667, 438/675, 25, 26
See application file for complete search history.

(56) References Cited

U.S. PATENT DOCUMENTS

| | | | |
|---|---|---|---|
| 2003/0006055 A1* | 1/2003 | Chien-Hung | ....... H01L 23/3107 174/534 |
| 2007/0020926 A1 | 1/2007 | Kalvesten | |
| 2010/0270571 A1* | 10/2010 | Seo | ....................... H01L 33/486 257/98 |
| 2013/0037309 A1 | 2/2013 | Kim | |
| 2016/0014878 A1 | 1/2016 | Kilhenny | |

FOREIGN PATENT DOCUMENTS

| | | |
|---|---|---|
| TW | 201123391 A1 | 1/2011 |
| WO | 2011059205 A2 | 5/2011 |
| WO | 2011/136417 A1 | 11/2011 |

OTHER PUBLICATIONS

Office Action in related TW application No. 106108084 dated Jan. 5, 2018; 5 pages. No English translation available.

* cited by examiner

SEMICONDUCTOR PACKAGE SUBSTRATE AND MANUFACTURING METHOD THEREFOR

CROSS-REFERENCE TO RELATED APPLICATION

The present application is a national phase entry under 35 U.S.C. § 371 of International Application No. PCT/KR2016/013053, filed Nov. 14, 2016, entitled "SEMICONDUCTOR PACKAGE SUBSTRATE AND MANUFACTURING METHOD THEREFOR," which designates the United States of America, which claims priority to KR Application No. 10-2016-0042401, filed Apr. 6, 2016, the entire disclosures of each of these applications are hereby incorporated by reference in their entireties and for all purposes.

TECHNICAL FIELD

The present invention relates to a semiconductor package substrate and a manufacturing method thereof, and more particularly, to a semiconductor package substrate and a manufacturing method thereof capable of improving pattern accuracy and product reliability through simple processes.

BACKGROUND ART

Since a semiconductor device is used as being packaged on a semiconductor package substrate, a semiconductor package substrate used in the packaging has microcircuit patterns and/or input/output (I/O) terminals. As high performance and/or high integration of semiconductor devices, and miniaturization and/or high performance of electronic devices using the semiconductor devices have progressed, microcircuit patterns of the semiconductor package substrate have had smaller line widths and higher complexity.

When a semiconductor package substrate is manufactured according to the related art, a copper clad laminate (CCL) on which copper foils are stacked is used to form a through hole, and an internal surface of the through hole is plated to electrically connect an upper copper foil and a lower copper foil to each other, and then, the upper copper foil and the lower copper foil are respectively patterned by using photoresist. However, according to the method of manufacturing the semiconductor package substrate of the related art, manufacturing processes are complicated and a low accuracy is shown.

DETAILED DESCRIPTION OF THE INVENTIVE CONCEPT

Technical Problem

One or more embodiments of the present invention include a semiconductor package substrate and a manufacturing method thereof capable of improving pattern accuracy and product reliability with simple processes. However, the above technical problem is exemplary, and the scope of the present invention is not limited thereto.

Technical Solution

According to an embodiment of the present invention, there is provided a semiconductor package substrate including: a base substrate having a conductive material, and including a first area, on which chips are mounted, including first recesses or first trenches in a surface, and a second area contacting the first area and including dummy recesses or dummy trenches in a surface; and a resin filled in the first recesses or the first trenches and the dummy recesses or the dummy trenches.

The second area may be a frame area extending in a direction.

The second area may be located at an outer portion or a center portion of the base substrate.

The semiconductor package substrate may further include second recesses or second trenches only in the first area on an opposite surface of the base substrate so as to at least partially expose the resin.

The second recesses or second trenches may be located in other portions than an opposite surface of the second area.

According to an embodiment of the present invention, there is provided a method of manufacturing a semiconductor package substrate, the method including: preparing a base substrate having a conductive material and including a first area, on which chips are mounted, and a second area contacting the first area; forming first recesses or first trenches in the first area on a surface of the base substrate; forming dummy recesses or dummy trenches in the second area on the surface of the base substrate; filling the first recesses or the first trenches and the dummy recesses or the dummy trenches with a resin; hardening the resin; and etching an opposite surface of the base substrate so as to at least partially expose the resin filled in the first recesses or the first trenches.

The second area may be a frame area extending in a direction.

The second area may be located at an outer portion or a center portion of the base substrate.

The forming of the first recesses or the first trenches and the forming of the dummy recesses or the dummy trenches may be simultaneously performed.

The etching of the opposite surface of the base substrate may include etching the first area on the opposite surface of the base substrate and not etching the second area on the opposite surface of the base substrate.

Other aspects, features and advantages of the present invention will become better understood through the accompanying drawings, the claims and the detailed description.

Such general and specific aspects of the present invention may be performed using systems, methods, computer-readable storage mediums, and/or combinations thereof.

Advantageous Effects

According to embodiments of the present invention, a semiconductor package substrate and a manufacturing method thereof capable of improving pattern accuracy and product reliability with simple processes may be implemented. However, the scope of the invention is not limited to the above effects.

MODE OF THE INVENTION

Figure 1:
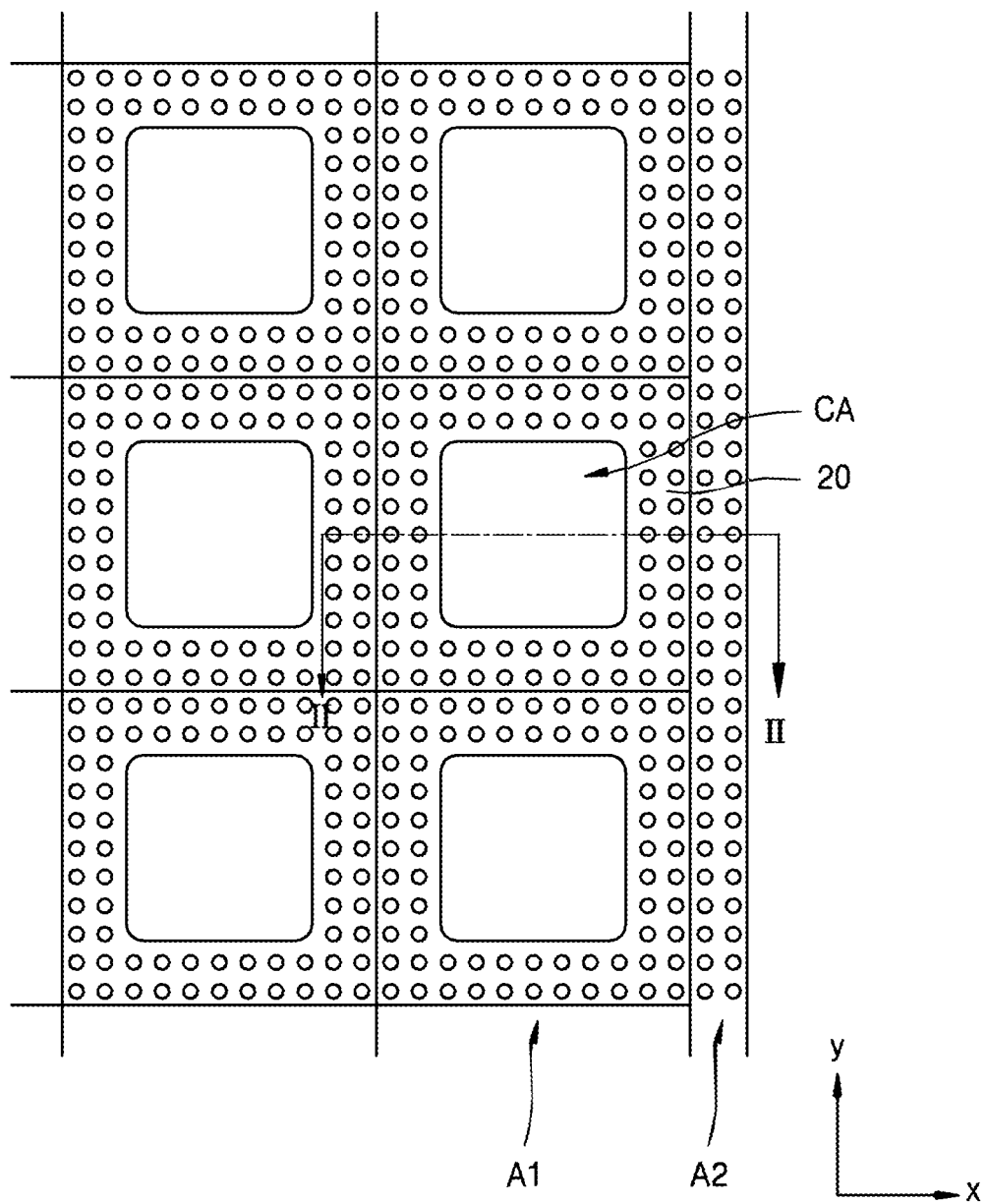
FIG. 1 is a schematic plan view of a semiconductor package substrate according to an embodiment of the present invention.

As the present invention allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The exemplary embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components must not be limited to the above terms. The above terms are used only to distinguish one component from another. An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a schematic plan view of a semiconductor package substrate according to an embodiment of the present invention, and FIGS. 2 to 5 are schematic cross-sectional views illustrating processes of manufacturing the semiconductor package substrate of FIG. 1. FIGS. 2 to 5 schematically show the semiconductor package substrate of FIG. 1 taken along a line II-II.

According to a method of manufacturing the semiconductor package substrate of the present embodiment, a base substrate 10 including a conductive material is prepared as shown in FIG. 1. The base substrate 10 may be formed as a flat plate including an electrically conductive material. The electrically conductive material may include, for example, Fe, an Fe alloy such as Fe—Ni, Fe—Ni—Co, etc., Cu, a Cu alloy such as Cu—Sn, Cu—Zr, Cu—Fe, Cu—Zn, etc., and the like.

The base substrate 10 may include a first area A1 and a second area A2 contacting the first area A1. The first area A1 is an area where a plurality of regions patterned as chip mounting regions are arranged in a matrix, and a chip area CA may be located at a center portion in each of the plurality of regions. The second area A2 is a frame area and may extend in a direction (Y-axis direction) at an outer portion or a center portion of the base substrate 10. In FIG. 1, the second area A2 is located at the outer portion of the base substrate 10. Although not shown in FIG. 1, when the second area A2 is located at the center portion of the base substrate 10, the first area A1 may be located at a side and an opposite side based on the second area A2.

Figure 2:
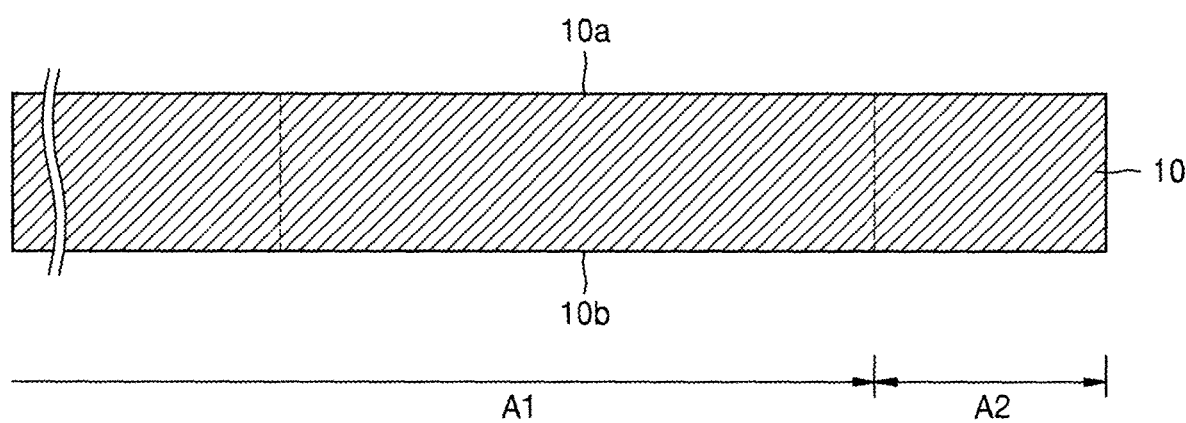
FIGS. 2 to 5 are schematic cross-sectional views illustrating processes of manufacturing the semiconductor package substrate of FIG. 1.
Figure 2:
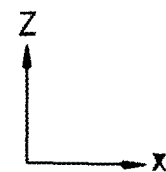
Figure 3:
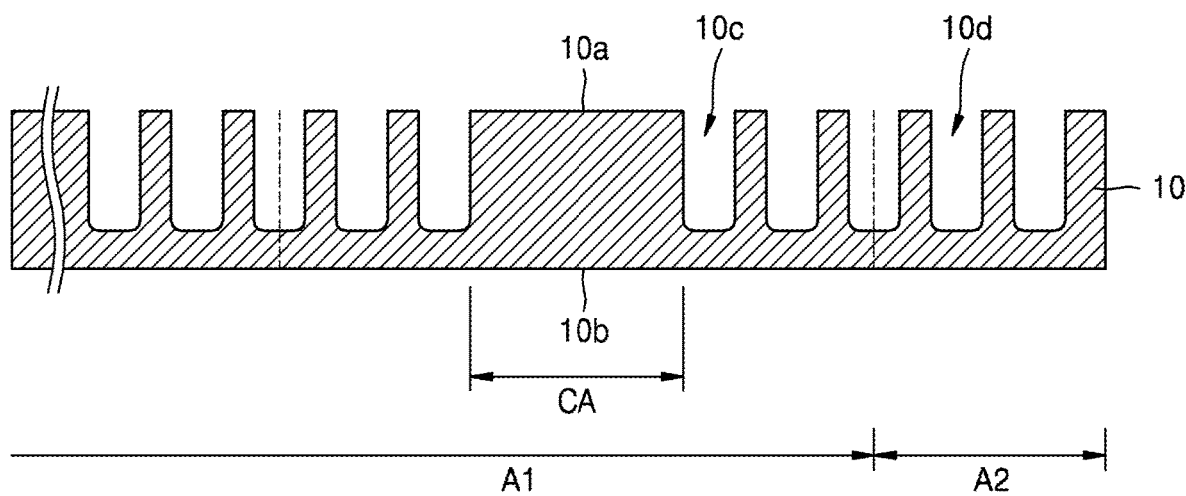

After that, referring to FIGS. 2 and 3, after preparing the base substrate 10 including the conductive material, first recesses or first trenches 10c may be formed in a surface 10a, between the surface 10a and an opposite surface 10b of the first area A1 in the base substrate 10, as shown in FIG. 3. Here, the first recesses or the first trenches 10c do not completely penetrate through the base substrate 10. Although not shown in FIG. 3 that is a cross-sectional view, in the surface 10a of the base substrate 10, the other portions than the first recesses or the first trenches 10c may be appreciated as wiring patterns extending in a direction or winding on a plane.

In addition, simultaneously with the forming of the first recesses or the first trenches 10c in the surface 10a of the first area A1, dummy recesses or dummy trenches 10d may be formed in the surface 10a of the second area A2. In FIG. 3, the first recess or the first trench 10c and the dummy recess or the dummy trench 10d have the same sizes as each other, but sizes and shapes of the first recess or the first trench 10c and the dummy recess or the dummy trench 10d may vary if necessary.

In order to form the first recesses or the first trenches 10c and the dummy recesses or the dummy trenches 10d, a dry film resist (DFR) including a photosensitive material is laminated on the surface 10a of the base substrate 10, and an exposure process, a development process, etc. are performed to expose only the portions where the first recesses or the first trenches 10c and the dummy recesses or the dummy trenches 10d are to be formed in the base substrate 10. After that, the portions of the surface 10a of the base substrate 10, wherein the portions not being covered by the DFR, are etched by using an etchant such as copper chloride or iron chloride, and thus, the first recesses or the first trenches 10c and the dummy recesses or the dummy trenches 10d may be formed in the surface 10a so as not to penetrate through the base substrate 10 as shown in FIG. 2.

On the surface 10a of the first area A1 in the base substrate 10, portions that are not removed, that is, the other portions than the first recesses or the first trenches 10c, may function as wiring patterns later. Therefore, when the first recesses or the first trenches 10c are formed in the surface 10a of the base substrate 10, a width of a portion between neighboring recesses or neighboring trenches may be about 20 μm to about 30 μm, that is, a width of a general wiring pattern.

Also, as shown in FIG. 2, when the first recesses or the first trenches 10c are formed in the surface 10a of the first area A1 in the base substrate 10, a depth of the first recess or the first trench 10c may be about 80% to about 90% of a thickness of the base substrate 10. For example, a remaining thickness of the base substrate 10 at the portions where the first recesses or the first trenches 10c are formed may be 10 μm to 40 μm.

If the first recesses or the first trenches 10c have a depth that is greater than the above example, it may not be easy to handle the base substrate 10 or the semiconductor package substrate during manufacturing processes of the semiconductor package substrate or packaging processes. Also, if the depth of the first recesses or the first trenches 10c is greater than the above example, a through hole penetrating through the surface 10a and the opposite surface 10b of the base substrate 10 may be formed due to a tolerance, etc. in some cases, while forming the first recesses or the first trenches 10c. On the other hand, if the depth of the first recess or the first trench 10c is less than the above example, it may be caused that post-processes of manufacturing the semiconductor package substrate are not easy to be performed or the finally produced semiconductor package substrate may be too small in thickness.

In addition, on the surface 10a of the second area A2 in the base substrate 10, other portions than the dummy recesses or the dummy trenches 10d may not function as wiring patterns, unlike the first recesses or the first trenches 10c. Therefore, a width of a portion between neighboring dummy recesses or the dummy trenches 10d may not be necessarily equal to that of the general wiring pattern. However, since the dummy recesses or the dummy trenches 10d are formed through the same processes as the first recesses or the first trenches 10c, the width of the portion between the adjacent dummy recesses or the dummy trenches 10d may be equal to that of the general wiring pattern for balance of the entire base substrate 10, and a remaining thickness of the portions where the dummy recesses or the dummy trenches 10d are formed may be about 10 µm to 40 µm like the first recesses or the first trenches 10c.

Through the above processes, the base substrate 10 may be entirely balanced in the manufacturing processes.

Figure 4:
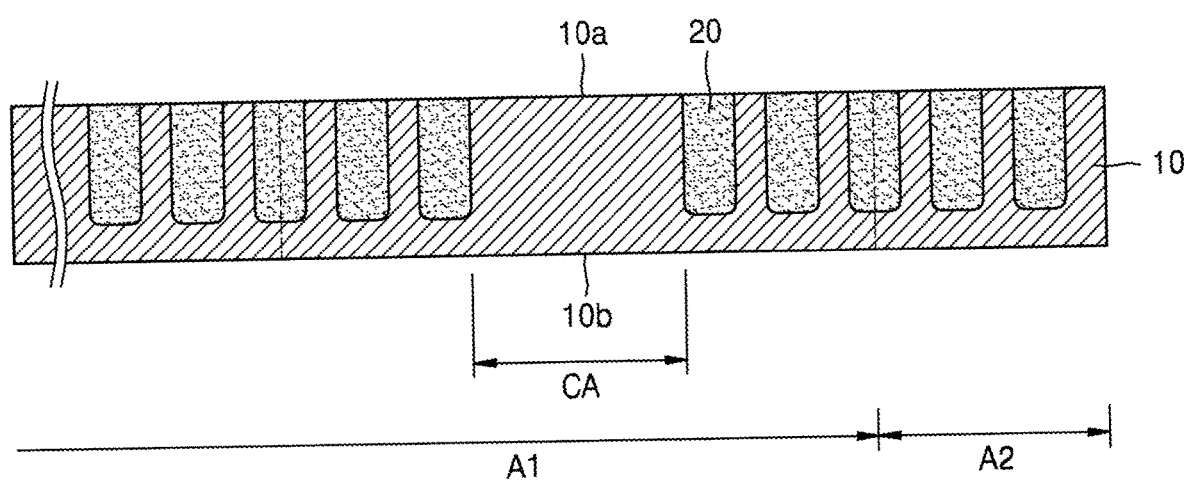

In addition, as shown in FIG. 4, the first recesses or the first trenches 10c and the dummy recesses or the dummy trenches 10d in the base substrate 10 are filled with a resin 20. The resin 20 may include an insulating material that is not electrically conductive. For example, the resin 20 may be a thermosetting resin that is polymerized and hardened by a thermal process. The resin 20 may electrically insulate between the wiring patterns in the semiconductor package substrate. Filling of the resin 20 may be performed by using a liquid phase resin material, or a solid phase tape including a resin component.

When the resin 20 is filled, the resin 20 may not only fill in the first recesses or the first trenches 10c or the dummy recesses or the dummy trenches 10d of the base substrate 10 as shown in FIG. 4, but may also at least partially cover the surface 10a of the base substrate 10, although not shown in the drawings. If the resin 20 is overly applied as described above, the overly applied resin 20 may be removed by a mechanical process such as brushing, grinding, or polishing, or a chemical resin etching process, so that the resin 20 may only fill in the first recesses or the first trenches 10c and the dummy recesses or the dummy trenches 10d of the base substrate 10 as shown in FIG. 4.

Figure 5:
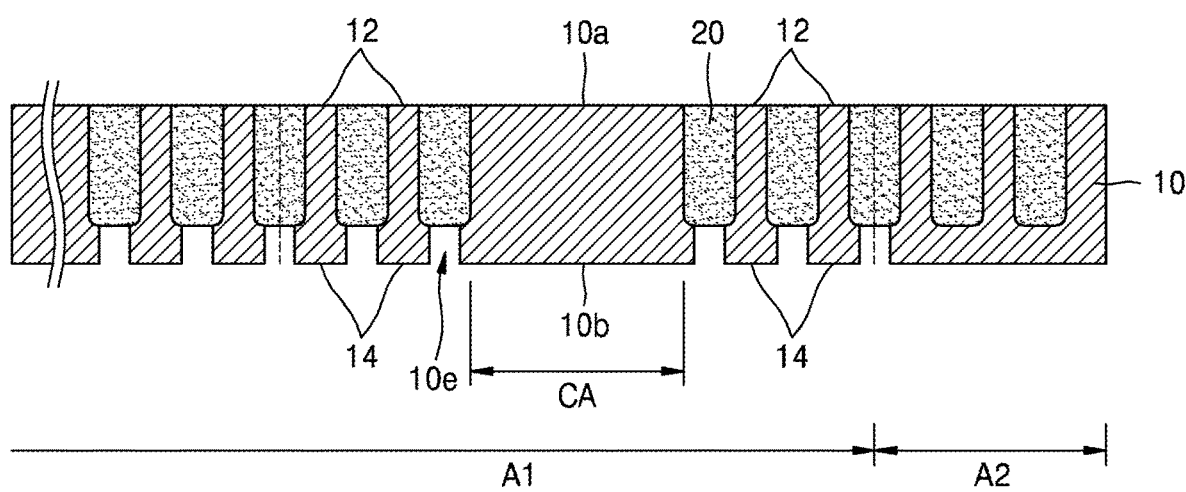

After that, as shown in FIG. 5, the opposite surface 10b of the base substrate 10 is etched to form second recesses or second trenches 10e so that the resin 20 filled in the first recesses or the first trenches 10c may be exposed. Etching of the opposite surface 10b of the base substrate 10 may be performed in various ways, for example, the DFR including the photosensitive material may be laminated on the opposite surface 10b of the base substrate 10, and then, an exposure, a development, etc. are performed so as to expose only the portions to be etched on the opposite surface 10b of the base substrate 10. After that, the portions of the opposite surface 10b of the base substrate 10, wherein the portions not being covered by the DFR, are etched by using an etchant such as copper chloride or iron chloride, and thus, the second recesses or second trenches 10e may be formed in the opposite surface 10b so as to at least partially expose the resin 20 as shown in FIG. 5.

In addition, during the above processes, the opposite surface 10b corresponding to the second area A2 in the base substrate 10 may not be etched. That is, the opposite surface 10b of the second area A2, in which the dummy recesses or the dummy trenches 10d are located, in the base substrate 10 is not etched. As described above, since the second area A2 of the base substrate 10 is the frame area in which wires do not need to be arranged, and thus, the dummy recesses or the dummy trenches 10d are not formed for arranging the wires.

The resin 20 used in the above-described processes is harder than a general resin for FC. Therefore, during a process of removing the resin through a mechanical processing or a process of partially etching the opposite surface 10b of the base substrate 10 after filling the resin 20, crack may occur in the resin 20 due to an external force. In order to address the above problem, according to the embodiment of the present invention, dummy recesses or the dummy trenches 10d may be further formed in the second area A2, that is, the frame area, during the surface 10a of the base substrate 10 is etched. Due to the dummy recesses or the dummy trenches 10d, the base substrate 10 may maintain balance between left and right sides thereof while being processed, and thus, the external force applied to the resin 20 may be distributed to prevent cracks from occurring in the resin 20.

According to the above processes, wiring patterns 12 between the resin 20 may be shown in a surface of the base substrate 10 and wiring patterns 14 between the resin 20 are also shown in the opposite surface of the base substrate 10.

If necessary, additional processes may be further performed. For example, the remaining portion of the base substrate 10 may be at least partially plated by Au, Pd, etc., or an organic solderbility preservative (OSP) coating may be performed at least partially on the remaining portion of the base substrate 10. This is performed to improve a solder adhesive force of the remaining portion of the base substrate 10.

The method of manufacturing the semiconductor package substrate has been described, but the present invention is not limited thereto. For example, the semiconductor package substrate manufactured by the above manufacturing method of the semiconductor package substrate may be also included in the scope of the present invention.

FIG. 5 is a schematic cross-sectional view of the semiconductor package substrate according to an embodiment of the present invention. FIG. 5 schematically shows the semiconductor package substrate of FIG. 1 taken along a line II-II.

Referring to FIGS. 1 and 5, the semiconductor package substrate according to the embodiment includes the base substrate 10, and the resin 20 partially filled in the base substrate 10. The base substrate 10 may have a flat plate shape including an electrically conductive material as a conductive material. The electrically conductive material may include, for example, Fe, an Fe alloy such as Fe—Ni, Fe—Ni—Co, etc., Cu, a Cu alloy such as Cu—Sn, Cu—Zr, Cu—Fe, Cu—Zn, etc., and the like.

The base substrate 10 may include a first area A1 and a second area A2 contacting the first area A1. The first area A1 is an area where a plurality of regions patterned as chip mounting regions arranged in a matrix, and a chip area CA may be located at a center portion in each of the plurality of regions. The second area A2 is a frame area and may be located to extend in a direction (Y-axis direction) at an outer portion or a center portion of the base substrate 10. In FIG.

1, the second area A2 is located at the outer portion of the base substrate 10. Although not shown in FIG. 1, when the second area A2 is located at the center portion of the base substrate 10, the first area A1 may be located at a side and an opposite side based on the second area A2.

The first recesses or the first trenches 10c may be located in the first area A1 of the surface 10a, between the surface 10a and the opposite surface 10b that are opposite to each other in the base substrate 10 of the conductive material. Here, the first recesses or the first trenches 10c do not completely penetrate through the base substrate 10. Although not shown in FIG. 5, that is, a cross-sectional view, in the surface 10a of the base substrate 10, the other portion than the first recesses or the first trenches 10c may be appreciated as the wiring patterns 12 extending in a direction or winding on a plane.

In addition, the dummy recesses or the dummy trenches 10d may be located in the surface 10a of the second area A2 of the base substrate 10. Although the first recesses or the first trenches 10c and the dummy recesses or the dummy trenches 10d are shown to have equal sizes in FIG. 5, sizes and shapes may be variously designed according to necessity.

On the surface 10a of the first area A1 in the base substrate 10, portions that are not removed, that is, the other portions than the first recesses or the first trenches 10c, may function as the wiring patterns 12 later. Therefore, in the first recesses or the first trenches 10c of the surface 10a of the base substrate 10, a width of a portion between neighboring recesses or neighboring trenches may be about 20 μm to about 30 μm, that is, a width of a general wiring pattern 12.

In addition, a depth of the first recesses or the first trenches 10c may be about 80% to about 90% of the thickness of the base substrate 10. For example, a remaining thickness of the base substrate 10 at the portions where the first recesses or the first trenches 10c are formed may be 10 μm to 40 μm.

If the first recesses or the first trenches 10c have a depth that is greater than the above example, it may not be easy to handle the base substrate 10 or the semiconductor package substrate during manufacturing processes of the semiconductor package substrate or packaging processes. Also, if the depth of the first recesses or the first trenches 10c is greater than the above example, a through hole penetrating through the surface 10a and the opposite surface 10b of the base substrate 10 may be formed due to a tolerance, etc., while forming the first recesses or the first trenches 10c in some cases. On the other hand, if the depth of the first recess or the first trench 10c is less than the above example, it may be caused that post-processes of manufacturing the semiconductor package substrate are not easy to be performed or the finally produced semiconductor package substrate may be too small in thickness.

In addition, on the surface 10a of the second area A2 in the base substrate 10, other portions than the dummy recesses or the dummy trenches 10d may not function as wiring patterns, unlike the first recesses or the first trenches 10c. Therefore, a width of a portion between neighboring dummy recesses or the dummy trenches 10d may not be necessarily equal to that of the general wiring pattern 12. However, since the dummy recesses or the dummy trenches 10d are formed through the same processes as the first recesses or the first trenches 10c, the width of the portion between the adjacent dummy recesses or the dummy trenches 10d may be equal to that of the general wiring pattern 12 for balance of the entire base substrate 10, and a remaining thickness of the portions where the dummy recesses or the dummy trenches 10d are formed may be about 10 μm to 40 μm like the first recesses or the first trenches 10c.

Through the above processes, the base substrate 10 may be entirely balanced in the manufacturing processes.

In addition, the first recesses or the first trenches 10c and the dummy recesses or the dummy trenches 10d in the base substrate 10 are filled with the resin 20. The resin 20 may include an insulating material that is not electrically conductive. For example, the resin 20 may be a thermosetting resin that is polymerized and hardened by a thermal process. The resin 20 may electrically insulate between the wiring patterns in the semiconductor package substrate. Filling of the resin 20 may be performed by using a liquid phase resin material, or a solid phase tape including a resin component.

In addition, second recesses or second trenches 10e may be only located in the first area A1 on the opposite surface 10b of the base substrate 10. The second recesses or second trenches 10e may be formed by etching the opposite surface 10b of the base substrate 10. The resin 20 filled in the first recesses or the first trenches 10c may be at least partially exposed through the second recesses or second trenches 10e. Patterns among the second recesses or second trenches 10e may be understood as wiring pattern 14.

In this case, the second recesses or second trenches 10e may not be located in the second area A2 on the opposite surface 10b of the base substrate 10. That is, during the manufacturing processes, the opposite surface 10b of the second area A2, in which the dummy recesses or the dummy trenches 10d are located, in the base substrate 10 is not etched. As described above, since the second area A2 of the base substrate 10 is the frame area in which wiring patterns do not need to be arranged, and thus, the dummy recesses or the dummy trenches 10d are not formed for arranging the wiring patterns.

The resin 20 used in the above-described processes is harder than a general resin for FC. Therefore, during a process of removing the resin through a mechanical processing or a process of partially etching the opposite surface 10b of the base substrate 10 after filling the resin 20, crack may occur in the resin 20 due to an external force. In order to address the above problem, according to the embodiment of the present invention, dummy recesses or the dummy trenches 10d may be further formed in the second area A2, that is, the frame area, during the surface 10a of the base substrate 10 is etched. Due to the dummy recesses or the dummy trenches 10d, the base substrate 10 may maintain balance between left and right sides thereof while being processed, and thus, the external force applied to the resin 20 may be distributed to prevent cracks from occurring in the resin 20.

While the detailed description has been particularly described with reference to non-obvious features of the present invention, it will be understood by one of ordinary skill in the art that various deletions, substitutions, and changes in form and details of the aforementioned apparatus and method may be made therein without departing from the spirit and scope of the following claims.

The invention claimed is:
1. A semiconductor package substrate comprising:
a base substrate including a conductive material, and comprising:
a first area, on which chips are mounted, comprising first recesses or first trenches in a surface, and second recesses or second trenches only in the first area on an opposite surface of the base substrate, a second area contacting the first area and comprising dummy recesses or dummy trenches in a surface; and a resin filled in the first recesses or the first trenches and the dummy recesses or the dummy trenches, wherein the second recesses or second trenches at least partially expose the resin, wherein width of the first recesses or the first trenches is greater than width of the second recesses or the second trenches.

2. The semiconductor package substrate of claim 1, wherein the second area is a frame area extending in a direction.

3. The semiconductor package substrate of claim 2, wherein the second area is located at an outer portion or a center portion of the base substrate.

4. The semiconductor package substrate of claim 1, wherein the second recesses or second trenches are located in other portions than an opposite surface of the second area.

5. A method of manufacturing a semiconductor package substrate, the method comprising:

preparing a base substrate including a conductive material and comprising a first area, on which chips are mounted, and a second area contacting the first area;

forming first recesses or first trenches in the first area on a surface of the base substrate;

forming dummy recesses or dummy trenches in the second area on the surface of the base substrate;

filling the first recesses or the first trenches and the dummy recesses or the dummy trenches with a resin;

hardening the resin; and forming second recesses or second trenches etching an opposite surface of the base substrate so as to at least partially expose the resin filled in the first recesses or the first trenches, wherein width of the first recesses or the first trenches is greater than width of the second recesses or second trenches.

6. The method of claim 5, wherein the second area is a frame area extending in a direction.

7. The method of claim 6, wherein the second area is located at an outer portion or a center portion of the base substrate.

8. The method of claim 5, wherein the forming of the first recesses or the first trenches and the forming of the dummy recesses or the dummy trenches are simultaneously performed.

9. The method of claim 5, wherein the etching of the opposite surface of the base substrate comprises etching the first area on the opposite surface of the base substrate and not etching the second area on the opposite surface of the base substrate.

* * * * *